United States Patent [19]
Phillips

[11] Patent Number: 5,306,970
[45] Date of Patent: Apr. 26, 1994

[54] SENSE AMPLIFIER AND METHOD FOR ITS OPERATION

[75] Inventor: Richard S. Phillips, Constance Bay, Canada

[73] Assignee: Northern Telecom Limited, Montreal, Canada

[21] Appl. No.: 993,874

[22] Filed: Dec. 23, 1992

[51] Int. Cl.$^5$ .................... H03K 5/24; G01R 19/00
[52] U.S. Cl. ........................... 307/530; 307/279; 307/355; 307/359; 365/208
[58] Field of Search ............... 307/355, 530, 279, 359; 365/208

[56] References Cited

U.S. PATENT DOCUMENTS

| | | | |
|---|---|---|---|
| 4,053,873 | 10/1977 | Freeman et al. | 365/208 |
| 5,155,397 | 10/1992 | Fassino et al. | 365/208 |
| 5,231,318 | 7/1993 | Reddy | 307/530 |

Primary Examiner—John Zazworsky
Attorney, Agent, or Firm—C. W. Junkin

[57] ABSTRACT

In a self-latching sense amplifier, a first pair of matched transistors is connected as a differential pair. A second pair of matched transistors is connected each to a respective one of the transistors of the first pair as a load transistor. A feedback circuit responsive to a differential output of the differential pair cross-couples the load transistors when the differential output is greater than a threshold value, and defeats cross-coupling of the load transistors when the differential output is less than the threshold value. The cross-coupling causes the output of the sense amplifier to latch. The sense amplifier is useful in memory circuits in which it is desired to shut down core components between memory operations to conserve power, and in other small signal detection circuits.

19 Claims, 2 Drawing Sheets

SENSE AMPLIFIER AND METHOD FOR ITS OPERATION

FIELD OF THE INVENTION

This invention relates to sense amplifiers and to methods for operating sense amplifiers.

BACKGROUND OF THE INVENTION

Memory circuits typically include sense amplifiers for amplifying output data read from selected memory cells, and output latches for retaining the amplified output data while other components of the memory circuit are shut down between read and write operations to reduce power consumption. The output latches must not operate until the amplified output data has stabilized at the correct output value. Otherwise, incorrect output data may be retained by the output latches and passed to circuits connected to the memory circuits.

To ensure that output latches retain correct output data, the output latches may be triggered by a signal which is timed so as to ensure that the amplified output data has already stabilized at the correct output value. Such a signal may be derived from the signal used to initiate the read operation by passing that signal through a delay element designed to simulate the delay between initiation of a read operation and stabilization of correct amplified output data. Such delay elements often comprise a series of inverters and delay capacitors.

Unfortunately variations in processes used to manufacture a memory circuit may have different effects on components used to construct delay elements and on other components of the memory circuit so that the delay provided by delay elements may not match the delay due to other components of the memory circuit. To ensure correct operation of the memory circuit, it is therefore necessary to build some timing margin into the simulated delay, and this timing margin increases the access and cycle times of the memory circuit.

The required timing margin can be reduced somewhat by constructing the delay element from components which are similar or identical to the components of the memory circuit which contribute to the delay between initiation of a read operation and stabilization of correct amplified output data. Variations in manufacturing process should then have more similar effects on the delay provided by the delay element and the delay provided by other components of the memory circuit. However, in large memory circuits, the components making up the delay element may be thousands of microns away from the components which contribute to the delay between initiation of a read operation and stabilization of correct amplified output data. Because processing conditions vary somewhat across the surface of large substrates, the simulated delay may still differ from the delay provided by other components of the memory circuit. Consequently, some timing margin is still required, and this remaining timing margin increases the access and cycle times of the memory circuit.

Alternatively, the output latches may be configured so that they cannot operate until valid amplified output data is supplied. For example, RS output latches may have Set and Reset inputs connected respectively to positive and negative outputs of corresponding sense amplifiers, so that the output latches will not operate until a valid "1" is applied to one of the Set or Reset inputs. Unfortunately, the sense amplifier input signal may develop slowly so that there is a considerable delay before a valid "1" is applied to an input of the output latch, and this increases memory access and cycle time.

SUMMARY OF THE INVENTION

This invention seeks to reduce or eliminate the problems associated with known sense amplifiers and output latches as described above by providing a self-latching sense amplifier which rapidly reaches and retains a valid amplified output data level.

One aspect of the invention provides a self-latching sense amplifier. The sense amplifier comprises a first pair of matched transistors connected as a differential pair and a second pair of matched transistors, each connected to a respective one of the transistors of the first pair as a load transistor. The amplifier further comprises a feedback circuit responsive to a differential output of the differential pair to cross-couple the load transistors when the differential output is greater than a threshold value, and to defeat cross-coupling of the load transistors when the differential output is less than the threshold value.

The feedback circuit may comprise an XNOR gate responsive to the differential output of the differential pair and a circuit responsive to an output of the XNOR gate to cross-couple the load transistors when the output of the XNOR gate is a logical "0" and to defeat cross-coupling of the load transistors when the output of the XNOR gate is a logical "1".

Advantageously, the XNOR gate may comprise an active pull-down circuit for actively pulling down the output of the XNOR gate during transition of that output from a logical "1" to a logical "0". The XNOR gate may also comprise a reset circuit for resetting the output of the XNOR gate to a logical "1" in response to a reset signal.

Another aspect of the invention provides a method of operating a sense amplifier which comprises a first pair of matched transistors connected as a differential pair and a second pair of matched transistors, each connected to a respective one of the transistors of the first pair as a load transistor. The method comprises operating the sense amplifier as a differential amplifier when a differential output of the sense amplifier is less than a threshold value, and cross-coupling the load transistors of the sense amplifier when the differential output exceeds the threshold value to latch the differential output of the sense amplifier.

Advantageously, the differential inputs of the sense amplifier may be grounded when the differential output exceeds the threshold value to save power and to permit a full voltage swing at the differential outputs once the sense amplifier is latched.

The cross-coupling of the load transistors may be defeated to unlatch the output of the sense amplifier in preparation for another read operation.

Advantageously, differential inputs of the sense amplifier may be equalized while unlatching the output of the sense amplifier to avoid re-latching previous output data.

The sense amplifier according to the invention and its method of operation eliminate the need for a critically-timed latch clock, and provide fast regenerative sensing and latching.

BRIEF DESCRIPTION OF THE DRAWINGS

Embodiments of the invention are described below by way of example only. Reference is made to accompanying drawings, in which.

DESCRIPTION OF EMBODIMENTS

Figure 1:
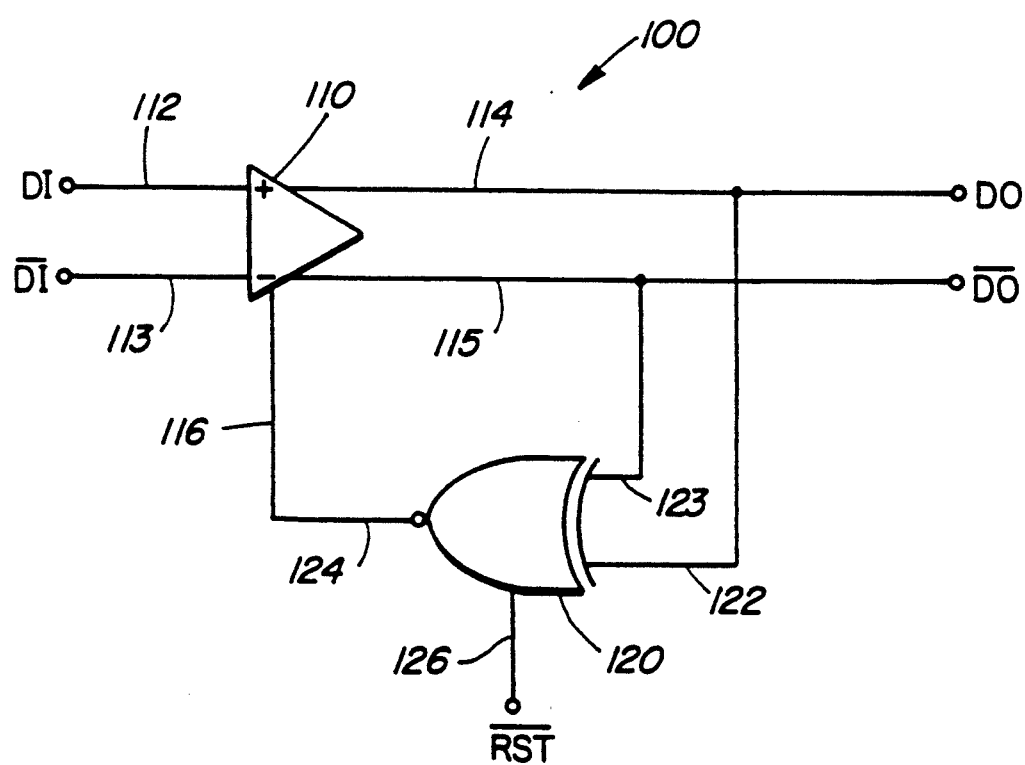
FIG. 1 is a block schematic diagram of a sense amplifier according an embodiment of the invention.
Figure 2:
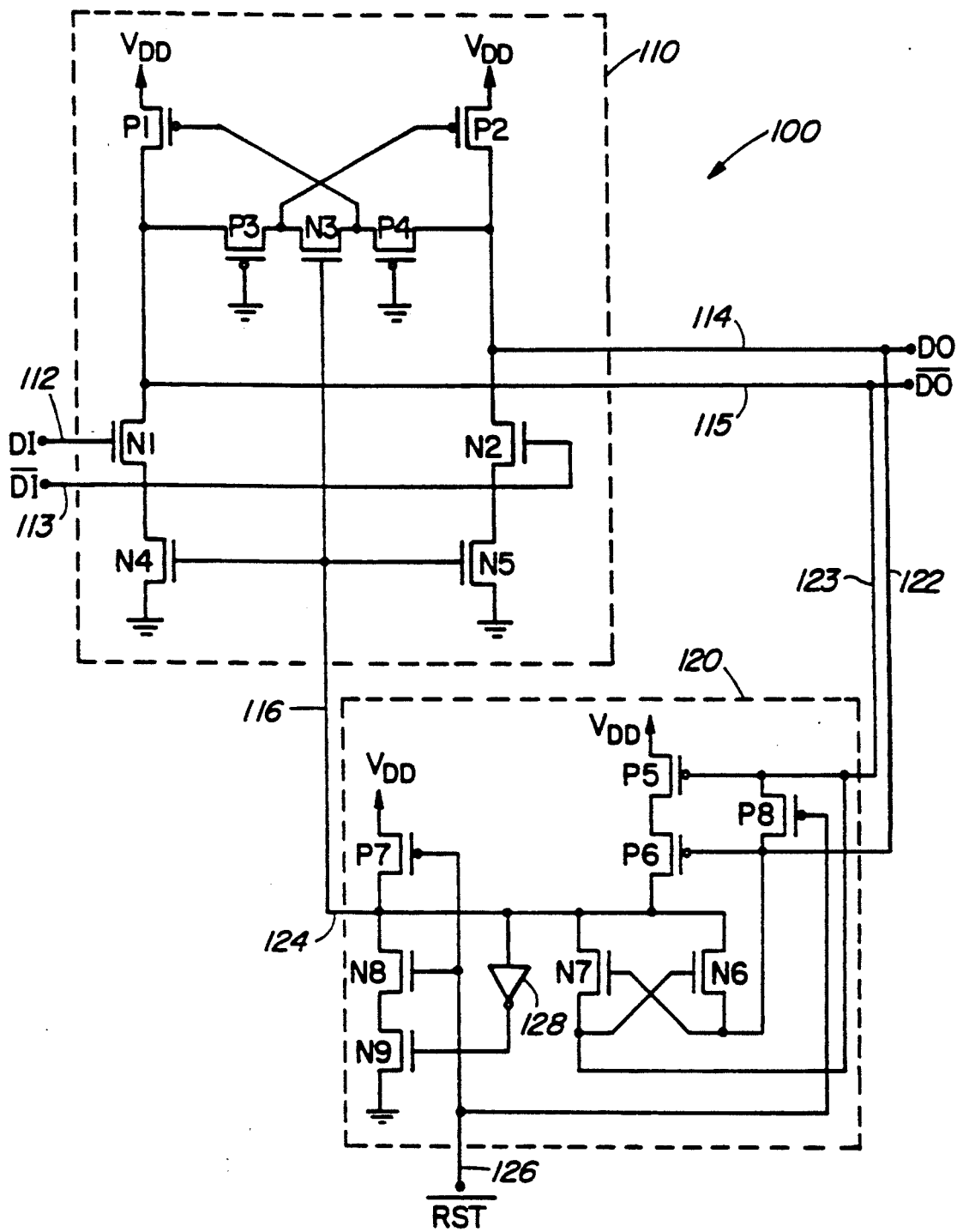
FIG. 2 is a circuit diagram showing a particular implementation of the sense amplifier of FIG. 1.

FIG. 1 is block schematic diagram of a sense amplifier 100 according to an embodiment of the invention. FIG. 2 is a circuit diagram showing a particular CMOS implementation of the sense amplifier 100 in greater detail.

The sense amplifier 100 comprises a specialized differential amplifier 110 and a specialized XNOR gate 120 providing feedback to the differential amplifier 110.

The differential amplifier 110 has positive and negative differential input terminals 112, 113, positive and negative differential output terminals 114, 115 and a feedback terminal 116. The XNOR gate 120 has input terminals 122, 123 connected to the positive and negative differential output terminals 114, 115 respectively of the differential amplifier 110, an output terminal 124 connected to the feedback terminal 116 of the differential amplifier 110 and a reset terminal 126.

The differential amplifier 110 comprises a pair of matched n-channel input MOSFETs N1, N2, a pair of matched p-channel load MOSFETs P1, P2, a pair of matched p-channel cross-coupling MOSFETs P3, P4, an n-channel shorting MOSFET N3 and a pair of matched n-channel current switch MOSFETs N4, N5. The n-channel current switch transistors N4, N5 each have a source connected to ground, a gate connected to the feedback terminal 116, and a drain connected to a source of a respective one of the n-channel input transistors N1, N2. The n-channel input transistors N1, N2 each have a gate connected to a respective differential input terminal 112, 113 and a drain connected to a respective differential output terminal 114, 115. The p-channel load transistors P1, P2 each have a source connected to a respective one of the differential output terminals 114, 115 and a drain connected to a positive voltage supply. Each p-channel cross-coupling transistor P3, P4 has a drain connected to a gate of a respective p-channel load transistor P1, P2, a source connected to the source of the other p-channel load transistor P1, P2, and a gate connected to ground. The n-channel shorting transistor N3 has a drain connected to the gate of one p-channel load transistor P1, a source connected to the gate of the other p-channel load transistor P2 and a gate connected to the feedback terminal 116.

The XNOR gate 120 comprises first and second long channel p-channel MOSFETs P5, P6, first and second n-channel MOSFETs N6, N7, an n-channel blocking MOSFET N8, an n-channel pull-down MOSFET N9, a p-channel pull up MOSFET P7, a p-channel shorting MOSFET P8 and an inverter 128. The first p-channel transistor P5 has a drain connected to a positive voltage supply, a gate connected to an input terminal 123, and a source connected to a drain of the second p-channel transistor P6. The second p-channel transistor P6 has a gate connected to the other input terminal 122 and a source connected to the output terminal 124. The first and second n-channel transistors N6, N7 each have a drain connected to the output terminal 124, a source connected to a respective one of the input terminals 122, 123, and a gate connected to the other of the input terminals 122, 123. The n channel blocking transistor N8 and the n-channel pull-down transistor N9 are connected in series between the output terminal 124 and ground, a gate of the blocking transistor N8 being connected to the reset terminal 126. The inverter 128 is connected between the output terminal 124 and a gate of the pull down transistor N9. The p-channel pull-up transistor P7 is connected between the output terminal 124 and a positive voltage supply, and has a gate connected to the reset terminal 126. The p-channel shorting transistor P8 is connected between the input terminals 122, 123 and has a gate connected to the reset terminal.

In operation of the sense amplifier 100, the reset terminal 126 is pulsed low at the beginning of a memory read cycle to pull the output terminal 124 of the XNOR gate 120 and the feedback terminal 116 of the differential amplifier high, and the differential input terminals 112, 113 are equalized at a precharge level. The long channel transistors P5, P6 of the XNOR gate 120 hold the feedback terminal 116 high so that the n-channel shorting transistor N3 is on, and the differential output terminals 114, 115 are equalized through the cross coupling transistors P3, P4 and the n-channel shorting transistor N3. The input transistors N1, N2 operate as a differential pair with the load transistors P1, P2 acting as a balanced load and the current switch transistors N4, N5 acting as switches to ground. The n-channel shorting transistor N3 defeats cross coupling of the load transistors P1, P2. For small input voltage swings the differential amplifier 100 operates conventionally, amplifying any differential voltage applied across the differential input terminals 112, 113.

When a memory cell is connected to the differential input terminals 112, 113 during a read operation, the differential amplifier 100 amplifies the differential voltage applied by the memory cell until the amplified differential voltage exceeds the n-channel threshold voltage of one of the n-channel transistors N6, N7. When the threshold voltage is exceeded, the XNOR gate 120 trips, and the voltage at the feedback terminal 116 drops rapidly to the lower of the voltages applied to the differential inputs 112, 113. As the voltage of the feedback terminal 116 drops, the n-channel shorting transistor N3 begins to turn off, allowing the amplified differential voltage to increase further. This positive feedback accelerates the increase of the amplified differential voltage.

As the voltage of the output terminal 124 and feedback terminal 116 drops, the pull-down transistor N9 turns on, pulling down the voltage of the output terminal 124 even faster, and turning the n-channel transistors N6, N7 into an n-channel cross-couple half-latch. (Blocking transistor N8 is turned on because the reset terminal 126 is still held high.) The cross-coupling of the n-channel transistors N6, N7 in combination with the cross-coupling of the p-channel load transistors P1, P2 of the differential amplifier 100 (which is unrestricted now that the n-channel shorting transistor N3 has turned off) provides single stage amplification and latching.

The dropping of the voltage on the feedback terminal 116 also turns off the current switch transistors N4, N5 of the differential amplifier 110 to save power and to permit a full CMOS output voltage swing at the differential output terminals 114, 115 once the circuit 100 has latched.

To unlatch the circuit in preparation for another memory read cycle, the voltages on the differential input terminals 112. 113 are equalized and the reset terminal 126 is pulsed low to turn the blocking transistor N8 off and the pull-up transistor P7 on. This operation pulls the output terminal 124 and the feedback terminal 116 up to turn on the n-channel shorting transistor N3, thereby defeating the cross-coupling of the load transistors P1, P2. The optional p channel shorting transistor P8 accelerates the return of the differential outputs 114, 115 to a balanced state. The voltages on the differential input terminals 112, 113 are equalized before application of the reset pulse to avoid relatching on data from the previous memory read cycle.

As described above, the n-channel transistors N6, N7 serve both as differential detection circuitry before the sense amplifier 100 latches and as a pull down cross-couple when the sense amplifier 100 latches. This efficient use Of circuit elements reduces the area required to implement the sense amplifier 100 on an integrated circuit.

The embodiment described above may be modified without departing from the principles of the invention. For example, the inventive circuit may be implemented in technologies other than CMOS and in alternative circuit configurations. These and other modifications are within the scope of the invention as claimed below.

I claim:

1. A self-latching sense amplifier, comprising:
   a first pair of matched transistors connected as a differential pair;
   a second pair of matched transistors, each connected to a respective one of the transistors of the first pair as a load transistor; and
   a feedback circuit responsive to a differential output of the differential pair to cross couple the load transistors when the differential output is greater than a threshold value, and to defeat cross-coupling of the load transistors when the differential output is less than the threshold value.

2. A self-latching sense amplifier as defined in claim 1, wherein the feedback circuit comprises:
   an XNOR gate responsive to the differential output of the differential pair; and
   a circuit responsive to an output of the XNOR gate to cross-couple the load transistors when the output of the XNOR gate is a logical "0" and to defeat cross-coupling of the load transistors when the output of the XNOR gate is a logical "1".

3. A self-latching sense amplifier as defined in claim 2, wherein the XNOR gate comprises a reset circuit for resetting the output of the XNOR gate to a logical "1" in response to a reset signal.

4. A self-latching sense amplifier as defined in claim 2, wherein:
   the first pair of matched transistors comprises a pair of FETs, each having a gate comprising a differential input terminal of the amplifier, a drain comprising a differential output terminal of the amplifier and a source connected to a current switch;
   the second pair of matched transistors comprises a pair of FETs, each having a source connected to a voltage supply, a drain connected to a respective one of the differential output terminals, and a gate cross-connected to the other of the differential output terminals via a respective FET of a third pair of matched FETs; and
   the circuit responsive to the output of the XNOR gate comprises a FET connected between the gates of the FETs comprising the second pair of matched transistors and having a gate connected to an output terminal of the XNOR gate.

5. A self-latching sense amplifier as defined in claim 4, wherein the current switches each comprise a respective FET of a fourth pair of matched FETs, each FET of the fourth pair having a drain connected to the source of a respective one of the first pair of matched transistors, a source connected to ground and a gate connected to the output terminal of the XNOR gate, the current sources turning off in response to a logical "0" on the output terminal of the XNOR gate.

6. A self-latching sense amplifier as defined in claim 4, wherein the XNOR gate comprises:
   a fifth pair of FETs connected in series between a voltage supply and the output terminal of the XNOR gate, each FET of the fifth pair having a gate connected to a respective differential output terminal of the amplifier; and
   a sixth pair of FETs, each having a drain connected to the output terminal of the XNOR gate, a source connected to a respective differential output terminal of the amplifier and a gate cross coupled to the source of the other FET of the sixth pair.

7. A self-latching sense amplifier as defined in claim 6, wherein the XNOR gate further comprises:
   a pull down FET connected between the output terminal of the XNOR gate and ground; and
   an inverter connected between the output terminal of the XNOR gate and a gate of the pull-down FET so that the pull-down FET shorts the output terminal to ground as the output of the XNOR gate changes from a logical "1" to a logical "0".

8. A self-latching sense amplifier as defined in claim 7, wherein the XNOR gate further comprises:
   a pull-up FET connected between the output terminal and a voltage supply, the pull-up FET having a gate connected to a reset terminal; and
   a blocking FET connected in series with the pull-down FET between the output terminal of the XNOR gate and ground, the blocking FET having a gate connected to the reset terminal;
   the pull-up FET and blocking FET being responsive to a reset signal on the reset terminal to reset the output of the XNOR gate to a logical "1".

9. A self-latching sense amplifier as defined in claim 8, wherein the XNOR gate further comprises a shorting FET connected between the gates of the fifth pair of FETs, the shorting FET having a gate connected to the reset terminal, the shorting FET being responsive to a reset signal on the reset terminal to equalize the differential outputs of the amplifier.

10. A self-latching sense amplifier, comprising:
    a pair of matched n channel MOS input transistors, each having a gate connected to a respective differential input terminal of the amplifier, a source connected to a respective current switch and a drain connected to a respective differential output terminal of the amplifier;
    a pair of matched p-channel MOS load transistors, each having a source connected to a positive voltage supply, a drain connected to a respective differential output terminal of the amplifier, and a gate;
    a pair of matched p channel MOS cross-coupling transistors, each having a drain connected to the gate of a respective p channel load transistor, a source connected to the source of the other p-channel load transistor and a gate connected to ground;

an n-channel MOS shorting transistor having a drain connected to the gate of one p channel load transistor, a source connected to the gate of the other p-channel load transistor and a gate; and a feedback circuit having a pair of input terminals, each connected to a respective one of the differential output terminals and an output terminal connected to the gate of the n channel shorting transistor, the feedback circuit being responsive to a voltage between the differential output terminals to turn on the n-channel shorting transistor when the voltage is less than a threshold value, thereby defeating cross-coupling of the p-channel load transistors by the p-channel cross-coupling transistors, and to turn off the n-channel shorting transistor when the voltage is greater than the threshold value, thereby permitting cross-coupling of the p-channel load transistors by the p-channel cross coupling transistors.

11. A self-latching sense amplifier as defined in claim 10, wherein the current switches comprise a matched pair n-channel MOS current switch transistors, each having a drain connected to the source of a respective n-channel input transistor, a source connected to ground and a gate connected to the gate of the n-channel shorting transistor, so that the n-channel current source transistors are on when the n channel shorting transistor is on and off when the n-channel shorting transistor is off.

12. A self latching sense amplifier as defined in claim 10, wherein the feedback circuit comprises:

a first p-channel MOS transistor having a source connected to a positive voltage supply, a gate connected to a respective one of the input terminals of the feedback circuit, and a drain;

a second p-channel MOS transistor having a source connected to the drain of the first p-channel transistor, a gate connected to the other of the input terminals of the feedback circuit; and a drain connected to the output terminal of the feedback circuit; and first and second n-channel MOS transistors, each having a drain connected to the output terminal of the feedback circuit, a source connected to a respective one of the input terminals of the feedback circuit, and a gate connected to the other of the input terminals of the feedback circuit.

13. A self-latching sense amplifier as defined in claim 12, wherein the feedback circuit further comprises:

an n-channel MOS pull-down transistor connected between the output terminal of the feedback circuit and ground; and an inverter connected between the output terminal of the feedback circuit and a gate of the n-channel pull-down transistor.

14. A self latching sense amplifier as defined in claim 13, wherein the feedback circuit further comprises:

a p-channel MOS pull-up transistor connected between the output terminal of the feedback circuit and a positive voltage supply;

an n-channel MOS blocking transistor connected in series with the n-channel pull-down transistor between the output terminal of the feedback circuit and ground; and a reset terminal connected to a gate of the p-channel pull-up transistor and to a gate of the n-channel blocking transistor.

15. A self-latching sense amplifier as defined in claim 14, wherein the feedback circuit further comprises a p-channel MOS shorting transistor connected between the input terminals of the feedback circuit, the p-channel shorting transistor having a gate connected to the reset terminal.

16. A method of operating a sense amplifier comprising a first pair of matched transistors connected as a differential pair and a second pair of matched transistors, each connected to a respective one of the transistors of the first pair as a load transistor, the method comprising:

operating the sense amplifier as a differential amplifier when a differential output of the sense amplifier is less than a threshold value; and cross-coupling the load transistors of the sense amplifier when the differential output exceeds the threshold value to latch the differential output of the sense amplifier.

17. A method of operating a sense amplifier as defined in claim 16, wherein the sense amplifier further comprises a pair of current switches each connected to a respective transistor of the differential pair, the method further comprising opening the current switches to interrupt current flow when the differential output exceeds the threshold value.

18. A method of operating a sense amplifier as defined in claim 16, further comprising defeating the cross-coupling of the load transistors to unlatch the output of the sense amplifier.

19. A method of operating a sense amplifier as defined in claim 18 further comprising equalizing differential inputs of the sense amplifier while unlatching the output of the sense amplifier.

* * * * *